United States Patent
Xu et al.

(10) Patent No.: US 9,195,146 B2
(45) Date of Patent: Nov. 24, 2015

(54) INTERFERENCE EXPOSURE DEVICE AND METHOD

(75) Inventors: Qixin Xu, Shanghai (CN); Fan Wang, Shanghai (CN)

(73) Assignee: SHANGHAI MICRO ELECTRONICS EQUIPMENT CO., LTD., Shanghai (CN)

( * ) Notice: Subject to any disclaimer, the term of this patent is extended or adjusted under 35 U.S.C. 154(b) by 33 days.

(21) Appl. No.: 14/239,515

(22) PCT Filed: Aug. 16, 2012

(86) PCT No.: PCT/CN2012/080258
§ 371 (c)(1),
(2), (4) Date: Feb. 18, 2014

(87) PCT Pub. No.: WO2013/026368
PCT Pub. Date: Feb. 28, 2013

(65) Prior Publication Data
US 2014/0176925 A1 Jun. 26, 2014

(30) Foreign Application Priority Data
Aug. 22, 2011 (CN) .......................... 2011 1 0241758

(51) Int. Cl.
*G03F 7/20* (2006.01)
*G01B 11/26* (2006.01)
(Continued)

(52) U.S. Cl.
CPC ............ *G03F 7/70208* (2013.01); *G01B 11/14* (2013.01); *G01B 11/26* (2013.01); *G03F 7/70408* (2013.01); *G03F 7/70775* (2013.01); *G03F 9/7007* (2013.01)

(58) Field of Classification Search
None
See application file for complete search history.

(56) References Cited

U.S. PATENT DOCUMENTS 4,631,416 A * 12/1986 Trutna, Jr. ...................... 250/548
4,806,442 A * 2/1989 Shirasaki et al. ................. 430/4
(Continued)

FOREIGN PATENT DOCUMENTS

| EP | 1 818 699 A1 | 8/2007 |
| JP | 2002-162750 A | 6/2002 |

(Continued)

OTHER PUBLICATIONS

Bourov et al, "Immersion microlithography at 193 nm with a Talbot prism interferometer," Proceedings of SPIE, 2004, pp. 1573-1578, vol. 5377.

*Primary Examiner* — Gordon J Stock, Jr.
(74) *Attorney, Agent, or Firm* — Muncy, Geissler, Olds & Lowe, P.C.

(57) ABSTRACT

An interference exposure device, including: a light source (100) for providing an exposure light beam; a light homogenizer-collimator (200) for homogenizing and collimating the exposure light beam; an interference unit (300) including at least two gratings (303) for converting the exposure light beam into at least two coherent light beams and making the coherent light beams converge on a substrate surface to form thereon an interference exposure pattern, the gratings (303) each having a period and being distributed in correspondence with a desired exposure pattern; a driving and supporting means (406) for supporting and carrying the substrate to move with at least three degrees of freedom; and a measuring element (500) for measuring an angle between coordinate systems of the interference unit (300) and the means (406) to adjust an exposure position of the means (406) based on a measurement result of the measuring element (500) before exposing the substrate.

11 Claims, 5 Drawing Sheets

(51) Int. Cl.
*G01B 11/14* (2006.01)
*G03F 9/00* (2006.01)

(56) References Cited

U.S. PATENT DOCUMENTS

| | | |
|---|---|---|
| 6,185,019 B1 * | 2/2001 | Hobbs et al. .................... 359/30 |
| 6,285,817 B1 | 9/2001 | Hobbs |
| 6,882,477 B1 | 4/2005 | Schattenburg et al. |
| 7,561,252 B2 | 7/2009 | Sewell et al. |
| 7,969,580 B2 | 6/2011 | Yen et al. |
| 2002/0149757 A1 * | 10/2002 | Kelsey et al. ................... 355/71 |
| 2002/0149849 A1 * | 10/2002 | Kelsey et al. ................. 359/577 |
| 2009/0257039 A1 | 10/2009 | Kishikawa et al. |

FOREIGN PATENT DOCUMENTS

| | | |
|---|---|---|
| JP | 2002-198301 A | 7/2002 |
| JP | 2007-264476 A | 10/2007 |
| JP | 2008-198799 A | 8/2008 |
| TW | 201001084 | 1/2010 |

* cited by examiner

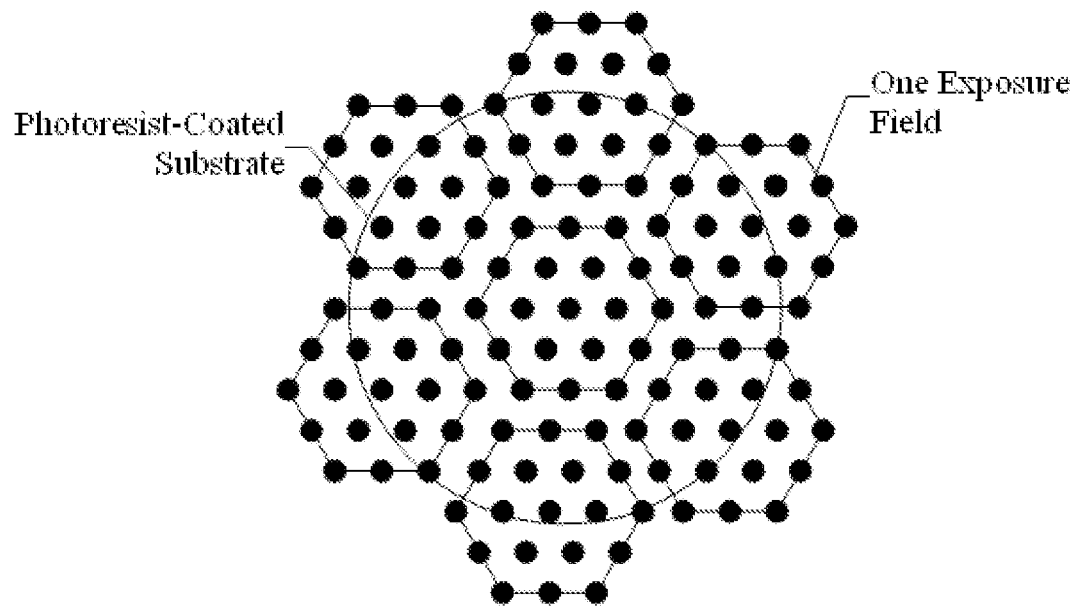
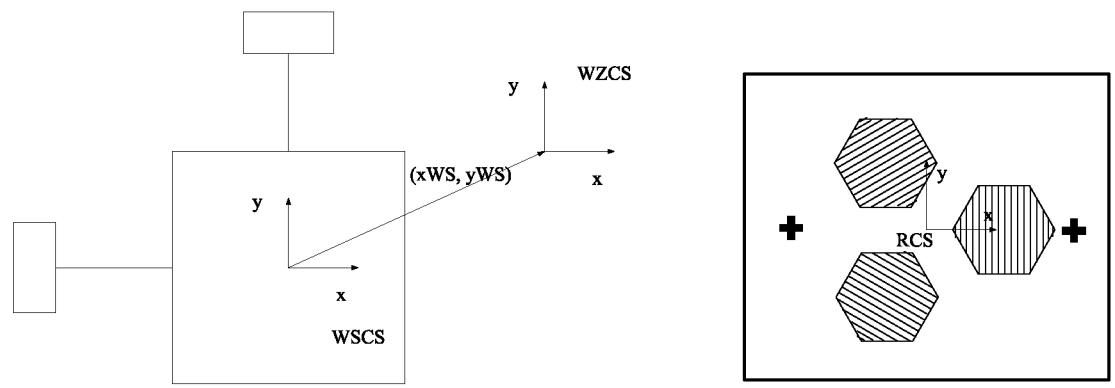
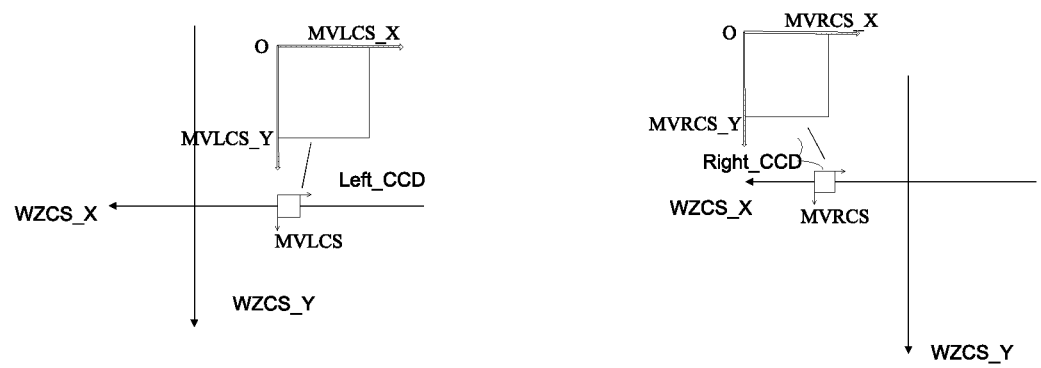
FIG. 8

INTERFERENCE EXPOSURE DEVICE AND METHOD

TECHNICAL FIELD

The present invention relates generally to the field of the fabrication of equipment for manufacturing integrated circuits, and more particularly, to a photolithography tool and a lithography exposure method.

BACKGROUND

Interference lithography techniques utilize both interference and diffraction characteristics of light to modulate a light-intensity distribution with a particular combination of light beams in an interference field. The light-intensity distribution can be recorded in a light-sensitive material and thereby form a lithography pattern.

Because of the advantages of high resolutions (relatively easily extendable to a quarter of the exposure wavelength) and large depth of focus (nearly equating the coherence length of the light source), interference lithography can be used in periodic patterning of dimensions of several dozens of nanometers to several micrometers.

Currently, devices incorporating periodic patterns, for example, such as long gratings, patterned sapphire substrate, photonic crystals, solar absorbers, field emission displays (FEDs) and so forth require the formation of an array of periodic patterns, either one-dimensional or two-dimensional, uniformly distributed in a high density on two to six inches sized substrates. A key technical problem is how to make sure that the feature patterns be distributed uniformly (i.e., with a very high stitching accuracy) on a substrate with a relative large area.

One of the conventional solutions is provided in U.S. Pat. No. 6,285,817, which describes the invention of a spherical-wave-based interference lithography method using multiple mutually interfering optical beams, wherein several point light sources disposed distal from a target substrate generate spherical waves which propagate and converge on photoresist coated on the substrate to form an interference pattern thereon over a large area. However, due to inherent wave-front distortions of the spherical waves themselves, there is an inconsistency between feature distributions around the center and along the periphery of the substrate.

Another one of the conventional solutions is provided in U.S. Pat. No. 7,561,252, which disclosed a "scan beam interference lithography (SBIL)" method, also referred to as the Doppler writing method. Although this method is capable of fabricating a long grating with a line width as narrow as 100 nm and a remarkably uniform feature distribution on a substrate sized as large as 12 inches, it is unduly complicated and thus cannot be used in the patterning of two-dimensional features.

A third one of the conventional solutions is provided in U.S. Pat. No. 6,882,477 and the literature "Immersion Microlithography at 193 nm with a Talbot Prism Interferometer", Proc. SPIE 5377, both of which described an interference lithography method using plane waves with wave-front distortions much smaller than those of the spherical waves. However, when this method is used in applications with large exposure fields, phase aberrations caused by various optical members and the environmental media will affect the uniformity of the exposure patterns. While the problem could be alleviated by reducing the exposure field and exposing the substrate field by field, this will cause another problem: as the orientation of the interference exposure patterns is different from the direction of the movement of the wafer stage, there exists an angle α (see FIG. 1) between the coherent interference light beams and the direction of movement of the stage, which can lead to stitching errors across the whole exposure field, as shown in FIG. 2.

As noted above, although there have been developed a number of lithography techniques based on light beam interference, all these techniques are limited for the critical applications where the patterning of periodic micrometer-scaled or nanometer-scaled features in a large area is needed.

SUMMARY OF THE INVENTION

To overcome the drawbacks of the conventional solutions, it is an objective of the present invention to provide an interference exposure apparatus and a method capable of high-uniformity pattern stitching in a large area and compatible with the printing of a vast variety of periodic pattern designs.

In pursuit of this objective, in one aspect, the present invention provides an interference exposure apparatus, including:

a light source for providing an exposure light beam;

a light homogenizer-collimator for homogenizing and collimating the exposure light beam emanating from the light source;

an interference unit including at least two gratings for converting the exposure light beam into at least two coherent light beams, the interference unit being movable in a vertical direction to make the at least two coherent light beams converge on a surface of a substrate to form an interference exposure pattern, the at least two gratings each having a period in correspondence with a period of a desired exposure pattern and being distributed in correspondence with a distribution characteristic of the desired exposure pattern;

a driving and supporting means for supporting the substrate and carrying the substrate to move with at least three degrees of freedom; and a measuring means for measuring an angle between a coordinate system of the interference unit and a coordinate system of the driving and supporting means so as to adjust an exposure position of the driving and supporting means based on a measurement result of the measuring means before exposing the substrate.

Further, the interference unit may include three gratings each in a shape of a regular hexagon and having grating-lines inclined at an angle of 120 degrees with respect to grating-lines of any of the other two gratings, or the interference unit may include two parallelly arranged rectangular gratings each having grating-lines in parallel with grating-lines of the other grating.

Further, the driving and supporting means may include an alignment mark; a diaphragm may be disposed between the driving and supporting means and the substrate; a reflection mirror may be disposed between the light homogenizer-collimator and the interference unit; the interference unit may be replaceable; and each grating may have a shape in correspondence with a shape of an exposure field.

In another aspect, the present invention provides an interference exposure method, including:

loading an interference unit and loading a substrate on a driving and supporting means;

measuring an angle between a coordinate system of the interference unit and a coordinate system of the driving and supporting means with a measuring means;

resetting an exposure position of the driving and supporting means according to the measured angle and a predetermined position of an exposure field;

moving the driving and supporting means to the reset exposure position; and making at least two coherent light beams converted, by the interference unit, from an exposure light beam emanating from a light source to converge on a surface of the substrate and exposing the substrate in a field-by-field manner.

Further, the exposure position $$\begin{bmatrix} x' \\ y' \end{bmatrix}$$

of the driving and supporting means may be calculated according to the following equation:

$$\begin{bmatrix} x' \\ y' \end{bmatrix} = \begin{bmatrix} \cos RR^{WZCS} & -\sin RR^{WZCS} \\ \sin RR^{WZCS} & \cos RR^{WZCS} \end{bmatrix} \begin{bmatrix} x_0 \\ y_0 \end{bmatrix},$$

where, $RR^{WZCS}$ represents the measured angle between the coordinate system of the interference unit and the coordinate system of the driving and supporting means, and $$\begin{bmatrix} x_0 \\ y_0 \end{bmatrix}$$

represents the predetermined position of the exposure field of the driving and supporting means.

In another aspect, the present invention provides an alignment means for stepper interference exposure, including at least two measuring elements disposed over an interference unit. The interference unit further includes at least two identification marks and the driving and supporting means comprises an alignment mark, and wherein the alignment means detects, through adjusting an imaging focal length thereof, the at least two identification marks on the interference unit and the alignment mark on the driving and supporting means.

In another aspect, the present invention provides an interference exposure method and alignment method for large-area periodic patterning of a substrate, including: performing an off-line calibration to determine conversion relations between coordinate systems of the first and second measuring elements and a zero coordinate system of the driving and supporting means, as well as a non-orthogonality and a distortion of each of the coordinate systems of the first and second measuring elements; moving the alignment mark of the driving and supporting means successively to reference positions respectively corresponding to aim positions in the coordinate systems of the first and second measuring elements, determining pixel positions of the alignment mark in the first and second measuring elements, and taking the determined pixel positions as updated aim positions; obtaining positions of the first and second identification marks of the interference unit, which are known parameters determined during the fabrication of the interference unit; determining pixel positions of the first and second identification marks in the first and second measuring elements, respectively; calculating offsets of the determined pixel positions of the first and second identification marks with respect to the updated aim positions; calculating a conversion factor from the coordinate system of the first measuring element to the zero coordinate system of the driving and supporting means and a conversion factor from the coordinate system of the second measuring element to the zero coordinate system of the driving and supporting means; converting the calculated offsets between the determined pixel positions with respect to the updated aim positions into offsets in the zero coordinate system of the driving and supporting means; determining reference alignment positions of the first and second identification marks in the zero coordinate system of the driving and supporting means; calculating actual positions of the first and second identification marks in the zero coordinate system of the driving and supporting means; solving an alignment model to obtain a rotation amount $RR_{WZCS}$ of the interference unit with respect to the zero coordinate system of the driving and supporting means; and calculating a target predetermined position $$\begin{bmatrix} x' \\ y' \end{bmatrix}$$

for a next stepping movement of the driving and supporting means according to $$\begin{bmatrix} x' \\ y' \end{bmatrix} = \begin{bmatrix} \cos RR^{WZCS} & -\sin RR^{WZCS} \\ \sin RR^{WZCS} & \cos RR^{WZCS} \end{bmatrix} \begin{bmatrix} x_0 \\ y_0 \end{bmatrix}.$$

Advantageously, by using the measuring means to measure the angular deviation between the interference pattern and the driving and supporting means (i.e., a wafer stage) and modifying the exposure position of the driving and supporting means based on the angular deviation, the interference exposure apparatus and method of the present invention is capable of high-uniformity pattern stitching in a large area. Also advantageously, as the interference unit is replaceable, the interference exposure apparatus and method of the present invention is compatible with the printing of a vast variety of periodic pattern designs.

BRIEF DESCRIPTION OF THE DRAWINGS

For a further understanding of the nature and advantages of the present invention, reference is made to the following detailed description, taken in conjunction with the accompanying drawings, wherein:

FIG. 7 depicts the stitching of exposure fields in accordance with the first embodiment of the present invention;

FIG. 8 is a graphic representation of the definitions of various coordinate systems of components of the interference exposure apparatus of the present invention;

DETAILED DESCRIPTION

The invention is explained in detail below on the basis of exemplary embodiments and the figures pertaining thereto.

Figure 3:
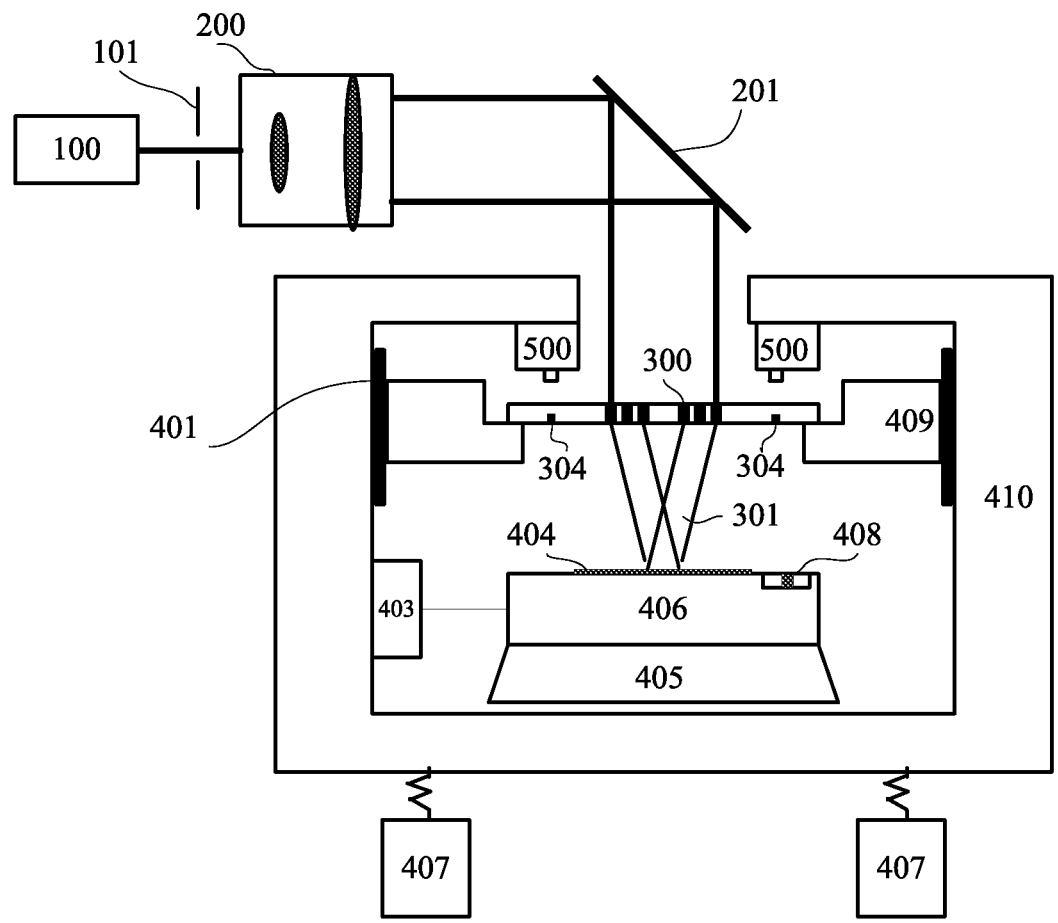
FIG. 3 is a schematic illustration of an interference exposure apparatus embodying the present invention.

The present invention is directed to an interference exposure apparatus suited to be used in large-area periodic patterning. As schematically illustrated in FIG. 3, the interference exposure apparatus includes: a light source 100 which emits a light beam for exposure; a light homogenizer-collimator 200 for homogenizing or collimating the light beam emanating from the light source 100; and an interference unit 300 for splitting the coherent light sources into at least two coherent paths (or referred as coherent light beams). The coherent light beams emanating from the interference unit 300 converge on a substrate (not shown) and are then incident on measuring elements 500. The interference exposure apparatus further includes a driving and supporting means 406 which supports the substrate and is able to carry the substrate to move with at least three degrees of freedom. The interference unit 300 is comprised of at least two blazed gratings. When there is a non-zero angle between orientations of the gratings of the interference unit 300 and the moving direction of the driving and supporting means 406, stitching errors will occur in the exposure pattern formed on the substrate. In this case, the non-zero angle can be measured by the measuring elements 500 and a corresponding compensation for the position of the driving and supporting means 406 can be made to eliminate the stitching errors.

With continuing reference to FIG. 3, below will be described in greater detail the interference exposure apparatus of the present invention and how it operates to achieve stitching-error-free, large-area periodic patterning.

As illustrated in FIG. 3, the interference exposure apparatus may include a laser device, i.e., the light source 100 which emits a Gaussian beam into the beam homogenizer-collimator 200. The Gaussian beam is collimated, by the beam homogenizer-collimator 200, into a uniform light beam with a diameter large enough to cover a grating region of the interference unit. Such beam homogenizer-collimator 200 is a widely used state-of-the-art device which would be well known to those skilled in the art and, therefore, need not be described in further detail herein.

Figure 4:
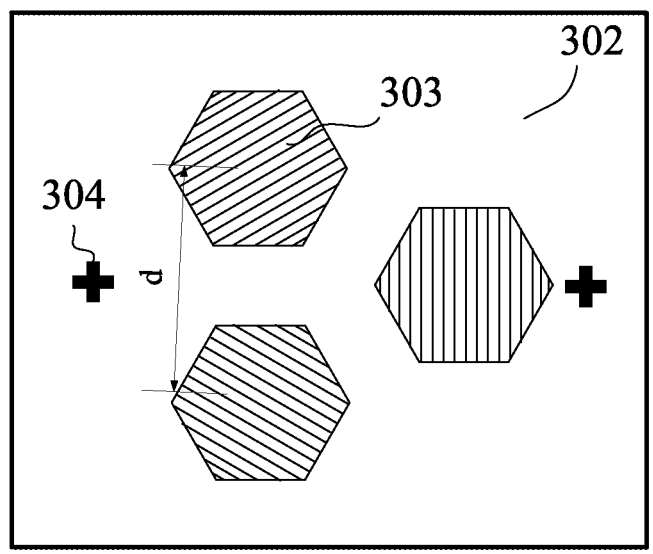
FIG. 4 depicts an interference unit of the interference exposure apparatus in accordance with a first embodiment of the present invention.

After collimated by and exiting the beam homogenizer-collimator 200, the laser beam may be deflected by a reflection mirror 201 onto the interference unit 300. In this invention, it is desirable that the interference unit 300 is capable of both splitting the coherent laser beams into coherent paths 301 and making the coherent paths 301 to converge at certain spatial angles. In one embodiment, as shown in FIG. 4, the interference unit 300 is chrome plating finished to form an opaque region 302. Additionally, in this embodiment, the interference unit 300 is configured with three one-dimensional blazed gratings 303 each having grating-lines inclined at an angle of 120 degrees with respect to grating-lines of any of the other two blazed gratings and at least two cross marks 304 serving as identification marks.

Figure 5:
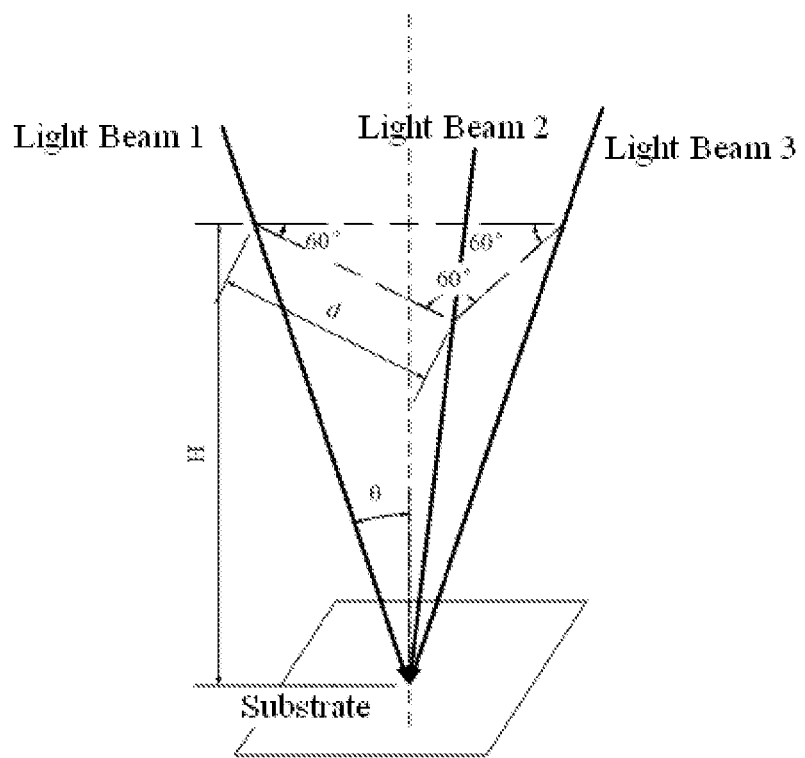
FIG. 5 depicts coherent light beams exiting from the interference unit in accordance with the first embodiment of the present invention.
Figure 6:
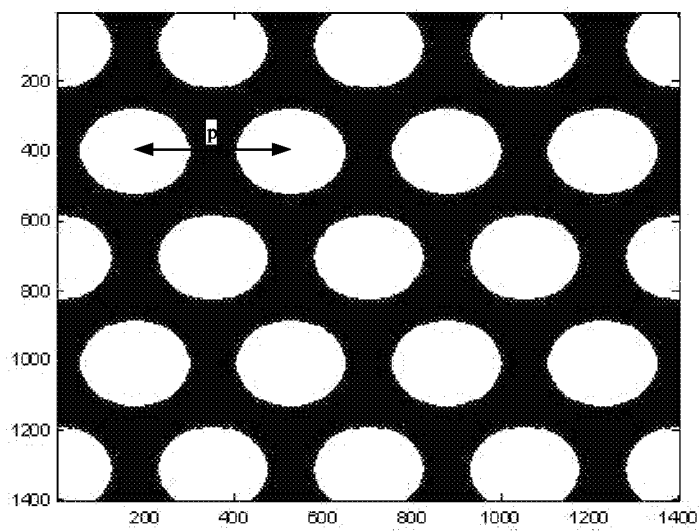
FIG. 6 depicts an exposure pattern in accordance with the first embodiment of the present invention.

After the laser beam is directed on the blazed grating region of the interference unit and diffracted thereby, a positive first (+1) order component is intensified and secondary components on other orders are suppressed, thus forming three coherent paths 301 (only two are shown). The coherent paths 301 converge on photoresist coated on the substrate that is sucked on the driving and supporting means 406 at an angle θ of diffraction of the +1 order component, as shown in FIG. 5. This leads to the formation of evenly and closely spaced dots, as shown in FIG. 6, in the region of the convergence of the three coherent light beams.

As indicated in the following equation (1), a distance p between every two neighboring closely-spaced dots is determined by the angle θ and the exposure wavelength λ, $$p = \frac{2\lambda}{3\sin\theta} \quad (1)$$

In this embodiment, since the interference unit is replaceable, the distance p can be conveniently changed by using a different interference unit with desired gratings. Moreover, since the interference unit functions like a reticle used in a projection lithography tool, different interference units can be loaded on a supporting platform 409 by an automated convey mechanism.

Diameter of the closely-spaced dots is determined by the duration of the exposure which is related to parameters such as the diameter of the closely-spaced dots, the characteristics of the photoresist and the illuminance of the light source on the substrate.

Furthermore, the area of the exposure field is determined by a total area of the blazed gratings engraved on the interference unit 300. Referring to FIG. 4, in this embodiment, each of the three gratings has a shape of a regular hexagon. As such, the area of the exposure field is exactly equal to the total area of the blazed gratings, enabling the controllability of the exposure field size. Also advantageously, the regular hexagonal shape can lead to a stitching-error-free exposure pattern, as shown in FIG. 7.

In the embodiment, since the angle θ of diffraction of the gratings is a determinant of the distance p of the closely-spaced dots as described above, the forming of closely-spaced dots with a different distance p will require variation of the angle θ, which further requires the alteration of a vertical depth of the interference region of the coherent light beams. The following equation (2) explaining the relation between a height H from the interference region to the interference unit plane and the angle θ can be easily obtained by performing some simple geometric calculations, $$H = \frac{d}{\sqrt{3}\tan\theta} \quad (2)$$

where, d is a distance between the centers of any two blazed gratings of the interference unit.

As described above, the substrate (not shown) is supported on the driving and supporting means 406 (i.e., a wafer stage), and the driving and supporting means 406 is able to carry the substrate to move with at least three degrees of freedom. Additionally, in order to achieve the best effect of the invention, the driving and supporting means 406 is placed on an air flotation system 405 to prevent any external disturbance. Moreover, all of the substrate, the driving and supporting means 406 and the air flotation system 405 may be disposed in a main frame 410 which is supported on air mounts 407 designed to minimize the influence of external vibrations on the interference exposure apparatus. Further, the aforementioned measuring elements 500 and other components of the interference exposure apparatus are all disposed in the space defined by the main frame 410.

The main frame 410 may be equipped on both sides with two one-dimensional linear rails 401 adapted to enable the vertical one-dimensional movement of the supporting platform 409 to ensure that the interference region of the coherent beams always occurs on the photoresist-coated surface of the substrate.

Moreover, a diaphragm 404 may be disposed above the photoresist-coated surface of the substrate for blocking the remaining zero (0) order diffracted light component from the gratings and other undesirable stray light from entering the interference region.

In practical operation, the driving and supporting means 406, floatingly supported on the main frame 410, is servo-controlled by a laser interferometer 403 rigidly fixed on the main frame 410 and carries the substrate to horizontally move in a step-by-step fashion. When the driving and supporting means 406 advances to and stays firmly at a predetermined position, a laser shutter 101 is activated and then deactivated after a certain period of time to accomplish the exposure of an exposure field associated with the predetermined position. After that, the driving and supporting means 406 advances to a next predetermined position for the exposure of another exposure field.

Figure 1:
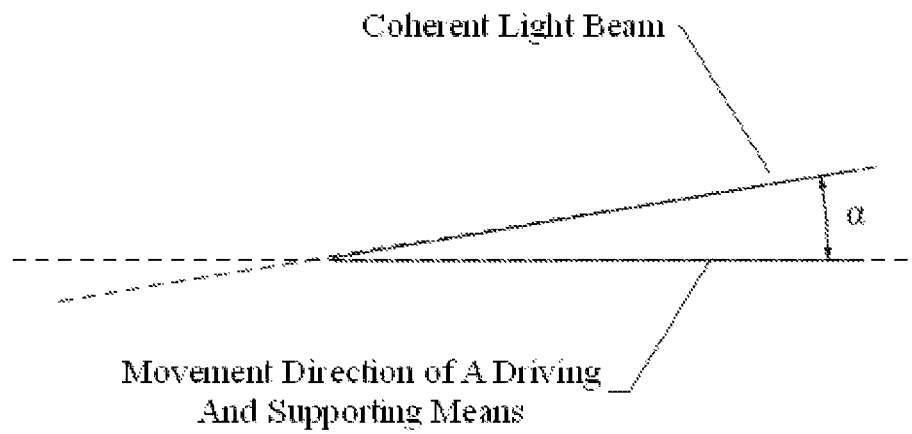
FIG. 1 schematically illustrates the scenario where there is a discrepancy between the direction of a coherent light beam and the movement direction of a driving and supporting means in accordance with the prior art.
Figure 2:
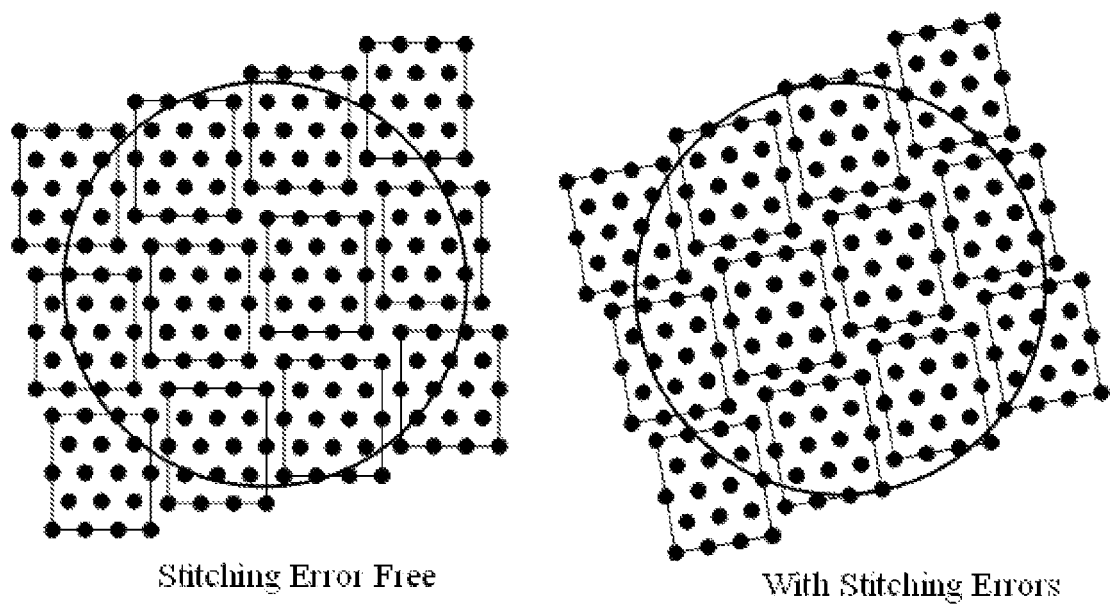
FIG. 2 shows stitching errors occurring in a process of large-area periodic patterning in accordance with the prior art.

If an angle α exists between the orientations of the gratings on the interference unit 300 and the movement direction of the driving and supporting means 406, as shown in FIG. 1, during the stepper exposure process, angle α will also exist between the plane of the associated interference pattern and the movement direction of the driving and supporting means 406 and thus creates stitching errors across the exposure patterns printed on the whole substrate, as shown in FIG. 2.

In this embodiment, charge-coupled device (CCD) cameras with a tunable focal length (i.e., the measuring element) 500 are mounted on both the left and right sides of the main frame 410, and the interference unit 300 is formed with two cross marks 304 that can be identified by the respective left and right CCD cameras. Moreover, the driving and supporting means 406 is configured with an alignment mark 408 which can be identified by either of the two CCD cameras 500. With such arrangement, the angle α can be measured in course of the CCD camera 500 identifying the two cross marks 304 of the interference unit 300 and the alignment mark 408 of the driving and supporting means 406 and compensated for in real time by means of modifying the predetermined position of the driving and supporting means 406. This process will be described in further detail below.

In order to provide a clear and consistent understanding of the process, the following definitions of several coordinate systems are provided prior to the description of the process. The definitions can be bettered understood when read in junction with FIG. 8 and include:

Driving and supporting means (i.e., the wafer stage) coordinate system (referred to hereinafter as the "WSCS"), a two-dimensional orthogonal coordinate system with the origin at the geometric center of the driving and supporting means and X and Y axes defined in a plane mirror of the laser interferometer;

Driving and supporting means zero coordinate system (referred to hereinafter as the "WZCS"), which coincides with the WSCS when the driving and supporting means is positioned at a zero position (0, 0), and with which, a position of the driving and supporting means can be conveniently expressed as a vector of the WZCS origin in WSCS, i.e., there is a simple translational relationship between WSCS and WZCS, that can be written as:

$$\begin{bmatrix} x^{WZCS} \\ y^{WZCS} \end{bmatrix} = \begin{bmatrix} x^{WSCS} \\ y^{WSCS} \end{bmatrix} - \begin{bmatrix} x^{WS} \\ y^{WS} \end{bmatrix} \quad (3)$$

Interference unit coordinate system (referred to hereinafter as the "RCS"), a two-dimensional orthogonal coordinate system with the origin at the geometric center of the interference unit and X and Y axes defined by corresponding geometric edges of the interference unit, which will change with the replacement of the interference unit;

Interference unit zero coordinate system (referred to hereinafter as the "RZCS"), a two-dimensional orthogonal coordinate system, which is a projection of the WZCS in the plane of the interference unit; and Left and right CCD camera (i.e., the measuring elements) coordinate systems (referred to hereinafter as the "MVLCS" and "MVRCS", respectively), two-dimensional orthogonal coordinate systems each with the origin at a logical pixel position (0, 0) in the CCD measuring system and coordinate axes perpendicular to corresponding imaging borders of the respective CCD camera.

Moreover, the following definitions of several positions are also provided for the sake of simplicity of explanation, including:

Aim Positions, MVLCS and MVRCS pixel positions of images of the cross marks on the interference unit captured respectively by the corresponding CCD cameras in the event that the cross marks are aligned in place;

Reference Positions, WZCS positions of the aim positions, the reference positions are constant and each in correspondence with one of the MVLCS and MVRCS aim positions; and Current Positions, MVLCS and MVRCS pixel positions of the cross marks of the interference unit and the alignment mark of the driving and supporting means detected in the respective left and right CCD cameras.

Further, as used herein, the term "angle α" is intended to refer to the angle between the RCS and WZCS that is to be determined by the process.

The process includes the following steps:

step 1: performing an off-line calibration to determine the following relations:

conversion relations between each of MVLCS and MVRCS and WZCS, i.e., how a pixel position in the left or right CCD camera is converted to a WZCS positional coordinate, conversion relations between each of MVLCS and MVRCS and RZCS, i.e., how a pixel position in the left or right CCD camera is converted to a RZCS positional coordinate, and non-orthogonalities and distortions of MVLCS and MVRCS;

step 2: aim position reset, including moving and successively positioning the alignment mark 408 of the driving and supporting means 406 at the reference positions respectively corresponding to the aim positions in the MVLCS and MVRCS to acquire pixel positions of the alignment mark 408 in the left and right CCD cameras, and taking the two acquired pixel positions as updated aim positions:

$\underline{x}_{RA}^{MVLCS}: (x_{RA}^{MVLCS}, y_{RA}^{MVLCS})$ $\underline{x}_{RA}^{MVRCS}: (x_{RA}^{MVRCS}, y_{RA}^{MVRCS});$ step 3: obtaining RCS positions of the left and right cross marks 304 on the interference unit 300, wherein the RCS positions have been determined with a sufficient accuracy during the fabrication of the interference unit 300:

$$\underline{x}_{LRM}^{RCS}: (x_{LRM}^{RCS}, y_{LRM}^{RCS})$$

$$\underline{x}_{RRM}^{RCS}: (x_{RRM}^{RCS}, y_{RRM}^{RCS})$$

step 4: determining current MVLCS and MVRCS pixel positions of the cross marks 304 in the left and right CCD cameras 500, respectively:

$$\underline{x}_{Cur}^{MVLCS}: (x_{Cur}^{MVLCS}, y_{Curr}^{MVLCS})$$

$$\underline{x}_{Cur}^{MVRCS}: (x_{Cur}^{MVRCS}, y_{Curr}^{MVRCS});$$ step 5: calculating offsets of the current positions with respect to the updated aim positions according to:

$$\underline{offset}_{CurToAim}^{MVLCS} = x_{RA}^{MVLCS} - x_{Cur}^{MVLCS} = \begin{pmatrix} x_{RA}^{MVLCS} - x_{Cur}^{MVLCS} \\ y_{RA}^{MVLCS} - y_{Cur}^{MVLCS} \end{pmatrix}$$

$$\underline{offset}_{CurToAim}^{MVRCS} = x_{RA}^{MVRCS} - x_{Cur}^{MVRCS} = \begin{pmatrix} x_{RA}^{MVRCS} - x_{Cur}^{MVRCS} \\ y_{RA}^{MVRCS} - y_{Cur}^{MVRCS} \end{pmatrix};$$

step 6: calculating a MVLCS-to-WZCS conversion factor $R_{MVL}^{WZ}$ and a MVRCS-to-WZCS conversion factor $R_{MVR}^{WZ}$;

step 7: converting the MVLCS and MVRCS offsets obtained in step 5 into WZCS offsets according to:

$$\underline{Loffset}_{AimToCur}^{WZCS} = R_{MVL}^{WZ} \cdot (\underline{x}_{Cur}^{MVLCS} - \underline{x}_{RA}^{MVLCS})$$

$$\underline{Roffset}_{AimToCur}^{WZCS} = R_{MVR}^{WZ} \cdot (\underline{x}_{Cur}^{MVRCS} - \underline{x}_{RA}^{MVRCS});$$

step 8: determining reference alignment positions of the cross marks 304 in WZCS: $\underline{x}_{LRA}^{WZCS}: (x_{LRA}^{WZCS}, y_{LRA}^{WZCS})$ and $\underline{x}_{RRA}^{WZCS}: (x_{RRA}^{WZCS}, y_{RRA}^{WZCS})$;

step 9: calculating WZCS positions of the left and right cross marks 304, $\underline{x}_{LRM}^{WZCS}: (x_{LRM}^{WZCS}, y_{LRM}^{WZCS})$ and $\underline{x}_{RRM}^{WZCS}: (x_{RRM}^{WZCS}, y_{RRM}^{WZCS})$, according to:

$$\underline{x}_{LRM}^{WZCS} = \underline{x}_{LRA}^{WZCS} + \underline{Loffset}_{AimtoCur}^{WZCS}$$

$$\underline{x}_{RRM}^{WZCS} = \underline{x}_{RRA}^{WZCS} + \underline{Roffset}_{AimtoCur}^{WZCS};$$

step 10: given that the WZCS positions of the cross marks 304 satisfy the following simultaneous equations:

$$\begin{bmatrix} x_{RM}^{WZCS} \\ y_{RM}^{WZCS} \end{bmatrix} = \begin{bmatrix} Mr & 0 \\ 0 & Mr \end{bmatrix} \cdot \qquad (3)$$

$$\begin{bmatrix} \cos(RR^{WZCS}) & -\sin(RR^{WZCS}) \\ \sin(RR^{WZCS}) & \cos(RR^{WZCS}) \end{bmatrix} \cdot \begin{bmatrix} x_{RM}^{RCS} \\ y_{RM}^{RCS} \end{bmatrix} + \begin{bmatrix} Ro_x^{WZCS} \\ Ro_y^{WZCS} \end{bmatrix}$$

where, Mr represents the current magnification of the cross marks, $RR^{WZCS}$ represents the angle α between RCS and WSCS, and $Ro_x^{WZCS}$ and $Ro_y^{WZCS}$ represent relative translations between the two coordinate systems, and based on the measurement and conversion results of the cross marks 304, solving the simultaneous equations to obtain $RR^{WZCS}$ as:

$$RR^{WZCS} = B/A \qquad (4)$$

where, $$A = \frac{\delta x^{RCS} \cdot \delta x^{WZCS} + \delta y^{RCS} \cdot \delta y^{WZCS}}{(\delta x^{RCS})^2 + (\delta y^{RCS})^2},$$

-continued $$B = \frac{-\delta y^{RCS} \cdot \delta x^{WZCS} + \delta x^{RCS} \cdot \delta y^{WZCS}}{(\delta x^{RCS})^2 + (\delta y^{RCS})^2},$$

$$\delta x^{RCS} = x_{LRM}^{RCS} - x_{RRM}^{RCS},$$

$$\delta y^{RCS} = y_{LRM}^{RCS} - y_{RRM}^{RCS},$$

$$\delta x^{WZCS} = x_{LRM}^{WZCS} - x_{RRM}^{WZCS},$$

$$\delta y^{WZCS} = y_{LRM}^{WZCS} - y_{RRM}^{WZCS};$$

and step 11: calculating an updated predetermined position $$\begin{bmatrix} x' \\ y' \end{bmatrix}$$

of the driving and supporting means according to:

$$\begin{bmatrix} x' \\ y' \end{bmatrix} = \begin{bmatrix} \cos RR^{WZCS} & -\sin RR^{WZCS} \\ \sin RR^{WZCS} & \cos RR^{WZCS} \end{bmatrix} \begin{bmatrix} x_0 \\ y_0 \end{bmatrix} \qquad (5)$$

where, $$\begin{bmatrix} x_0 \\ y_0 \end{bmatrix}$$

is an original predetermined position for the driving and supporting means.

With these steps, the patterning of a large-area substrate can be accomplished with a high stitching accuracy.

Figure 9:
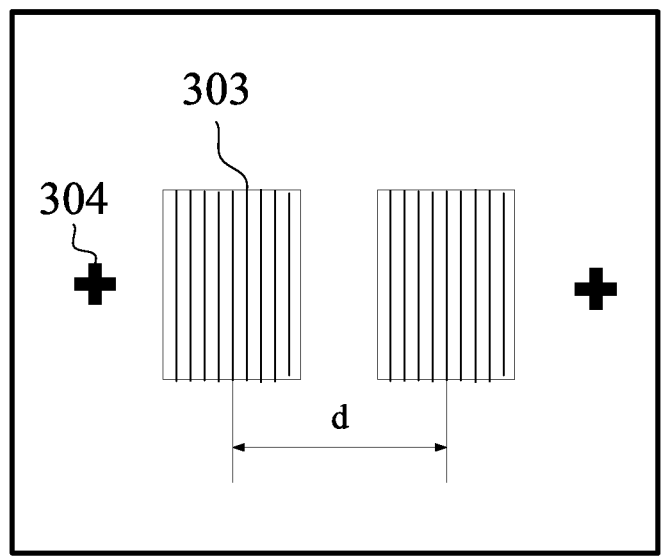
FIG. 9 depicts an interference unit of the interference exposure apparatus in accordance with a second embodiment of the present invention.
Figure 10:
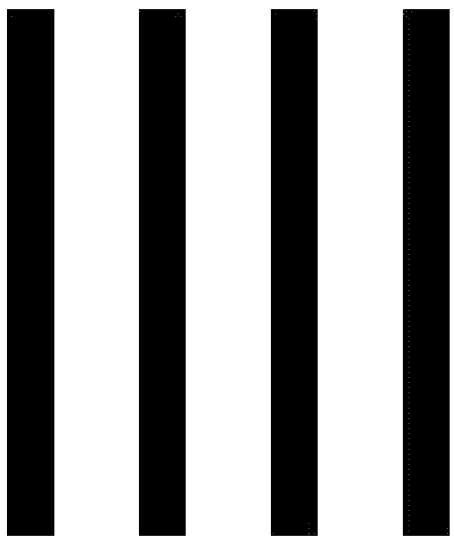
FIG. 10 depicts an exposure pattern in accordance with the second embodiment of the present invention.

The present invention further provides a second embodiment, which is different from the first embodiment in the pattern design of the interference unit 300. As shown in FIG. 9, the interference unit 300 of the second embodiment is configured with two parallelly arranged one-dimensional brazed gratings 303 and two detector-identification marks 304. The two one-dimensional brazed gratings 303 are rectangular and can produce two coherent light beams from an optical beam incident on the interference unit 300 of FIG. 9, and in a region of convergence of the two coherent light beams, there appear interference fringes as shown in FIG. 10. Moreover, in this case, the height H from the interference region to the interference unit plane and the angle θ is given by the following equation, $$H = \frac{d}{2\tan\theta} \qquad (5)$$

where, d is the distance between the centers of the two blazed gratings. Further, the compensation for the angle α can be based on the same equations as described in the foregoing paragraphs.

Advantageously, by using the measuring means to measure the angular deviation between the interference pattern and the driving and supporting means and modifying the exposure position of the driving and supporting means based on the angular deviation, the interference exposure apparatus and method of the present invention is capable of high-uniformity pattern stitching in a large area. Also advantageously, as the interference unit is replaceable, the interference exposure apparatus and method of the present invention is compatible with the printing of a vast variety of periodic pattern designs.

While certain preferred embodiments of the present invention are described in detail above, the scope of the invention is not to be considered limited by such disclosure. All alternative embodiments obtained by those skilled in the art through logical analysis, inference or limited experimentation in light of the above teachings are considered to be within the scope of the invention.

What is claimed is:

1. An interference exposure apparatus, comprising:
a light source for providing an exposure light beam;
a light homogenizer-collimator for homogenizing and collimating the exposure light beam emanating from the light source;
an interference unit including at least two gratings for converting the exposure light beam into at least two coherent light beams, the interference unit being movable in a vertical direction to make the at least two coherent light beams converge on a surface of a substrate to form an interference exposure pattern, the at least two gratings each having a period in correspondence with a period of a desired exposure pattern and being distributed in correspondence with a distribution characteristic of the desired exposure pattern;
driving and supporting means for supporting the substrate and carrying the substrate to move with at least three degrees of freedom; and
measuring and alignment means for measuring an angle between a coordinate system of the interference unit and a coordinate system of the driving and supporting means so as to adjust an exposure position of the driving and supporting means based on a measurement result of the measuring and alignment means before exposing the substrate.

2. The interference exposure apparatus of claim 1, wherein the interference unit includes three gratings each grating in a shape of a regular hexagon and having grating-lines inclined at an angle of 120 degrees with respect to grating-lines of any of the other two gratings, and wherein the interference exposure pattern formed on the substrate is an array of closely-spaced dots arranged in a regular hexagon.

3. The interference exposure apparatus of claim 1, wherein the interference unit includes two parallelly arranged rectangular gratings each grating having grating-lines in parallel with grating-lines of the other grating, and wherein the interference exposure pattern formed on the substrate is an array of lines.

4. The interference exposure apparatus of claim 1, wherein the driving and supporting means includes an alignment mark.

5. The interference exposure apparatus of claim 1, further comprising a diaphragm disposed between the driving and supporting means and the substrate.

6. The interference exposure apparatus of claim 1, wherein the interference unit is replaceable.

7. The interference exposure apparatus of claim 1, wherein each grating has a shape in correspondence with a shape of an exposure field.

8. An interference exposure method using the interference exposure apparatus according to claim 1, comprising:
loading the interference unit and loading the substrate on the driving and supporting means;
measuring the angle between the coordinate system of the interference unit and the coordinate system of the driving and supporting means with the measuring and alignment means;
resetting an exposure position of the driving and supporting means according to the measured angle and a predetermined position of an exposure field;
moving the driving and supporting means to the reset exposure position; and
making at least two coherent light beams converted, by the interference unit, from an exposure light beam emanating from the light source to converge on a surface of the substrate and exposing the substrate in a field-by-field manner.

9. The interference exposure method of claim 8, wherein the exposure position $$\begin{bmatrix} x' \\ y' \end{bmatrix}$$

of the driving and supporting means is calculated according to following equation:

$$\begin{bmatrix} x' \\ y' \end{bmatrix} = \begin{bmatrix} \cos RR^{WZCS} & -\sin RR^{WZCS} \\ \sin RR^{WZCS} & \cos RR^{WZCS} \end{bmatrix} \begin{bmatrix} x_0 \\ y_0 \end{bmatrix}$$

where, $RR^{WZCS}$ represents the measured angle between the coordinate system of the interference unit and the coordinate system of the driving and supporting means, and $$\begin{bmatrix} x_0 \\ y_0 \end{bmatrix}$$

represents the predetermined position of the exposure field of the driving and supporting means.

10. The interference exposure apparatus of claim 1, wherein the measuring and alignment means further comprises at least two measuring elements disposed over the interference unit,
wherein the interference unit further comprises at least two identification marks and the driving and supporting means comprises an alignment mark, and
wherein the measuring and alignment means detects, through adjusting an imaging focal length thereof, the at least two identification marks on the interference unit and the alignment mark on the driving and supporting means.

11. An interference exposure and alignment method for large-area periodic patterning of a substrate, the method using the interference exposure apparatus according to claim 10 with the measuring and alignment means including a first measuring element and a second measuring element and the interference unit including a first identification mark and a second identification mark, the method comprising steps of:
a) performing an off-line calibration to determine conversion relations between coordinate systems of the first and second measuring elements and a zero coordinate system of the driving and supporting means, as well as a non-orthogonality and a distortion of each of the coordinate systems of the first and second measuring elements;
b) moving the alignment mark of the driving and supporting means successively to reference positions respectively corresponding to aim positions in the coordinate systems of the first and second measuring elements, determining pixel positions of the alignment mark in the first and second measuring elements, and taking the determined pixel positions as updated aim positions;
c) obtaining positions of the first and second identification marks of the interference unit, which are known parameters determined during the fabrication of the interference unit;

d) determining pixel positions of the first and second identification marks in the first and second measuring elements, respectively;
e) calculating offsets of the determined pixel positions of the first and second identification marks with respect to the updated aim positions;
f) calculating a conversion factor from the coordinate system of the first measuring element to the zero coordinate system of the driving and supporting means and a conversion factor from the coordinate system of the second measuring element to the zero coordinate system of the driving and supporting means;
g) converting the calculated offsets between the determined pixel positions with respect to the updated aim positions into offsets in the zero coordinate system of the driving and supporting means;
h) determining reference alignment positions of the first and second identification marks in the zero coordinate system of the driving and supporting means;
i) calculating actual positions of the first and second identification marks in the zero coordinate system of the driving and supporting means;
j) solving an alignment model to obtain a rotation amount $RR_{WZCS}$ of the interference unit with respect to the zero coordinate system of the driving and supporting means; and
k) calculating a target predetermined position $$\begin{bmatrix} x' \\ y' \end{bmatrix}$$

for a next stepping movement of the driving and supporting means according to $$\begin{bmatrix} x' \\ y' \end{bmatrix} = \begin{bmatrix} \cos RR^{WZCS} & -\sin RR^{WZCS} \\ \sin RR^{WZCS} & \cos RR^{WZCS} \end{bmatrix} \begin{bmatrix} x_0 \\ y_0 \end{bmatrix}, \text{ where } \begin{bmatrix} x_0 \\ y_0 \end{bmatrix}$$

is an original predetermined position for the driving and supporting means.

* * * * *